(12) United States Patent
Chiang et al.

(10) Patent No.: US 11,153,973 B2
(45) Date of Patent: Oct. 19, 2021

(54) ELECTRONIC MODULE

(71) Applicant: CYNTEC CO., LTD., Hsinchu (TW)

(72) Inventors: Kaipeng Chiang, Taoyuan (TW);
Da-Jung Chen, Taoyuan (TW);
Bau-Ru Lu, Changhua County (TW);
Chun Hsien Lu, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 16/592,786

(22) Filed: Oct. 4, 2019

(65) Prior Publication Data
US 2021/0105898 A1 Apr. 8, 2021

(51) Int. Cl.
| | |
|---|---|
| *H05K 1/18* | (2006.01) |
| *H05K 1/02* | (2006.01) |
| *H05K 7/20* | (2006.01) |
| *H05K 3/34* | (2006.01) |
| *H02M 3/156* | (2006.01) |

(52) U.S. Cl.
CPC ............ *H05K 1/183* (2013.01); *H02M 3/156* (2013.01); *H05K 1/0203* (2013.01); *H05K 1/181* (2013.01); *H05K 1/185* (2013.01); *H05K 3/3415* (2013.01); *H05K 3/3447* (2013.01); *H05K 7/20* (2013.01); *H05K 2201/066* (2013.01); *H05K 2201/1003* (2013.01); *H05K 2201/10613* (2013.01)

(58) Field of Classification Search
CPC ....... H05K 1/141; H05K 1/181; H01L 3/3128
See application file for complete search history.

(56) References Cited

U.S. PATENT DOCUMENTS

| | | | | |
|---|---|---|---|---|
| 5,270,492 | A | * | 12/1993 | Fukui ................ H01L 23/49541 174/250 |
| 5,370,540 | A | * | 12/1994 | Kobayashi ........... H01R 43/205 439/590 |
| 6,005,773 | A | * | 12/1999 | Rozman .................. H02M 3/00 361/707 |
| 9,269,699 | B2 | * | 2/2016 | Niu .................... H01L 21/76802 |

\* cited by examiner

*Primary Examiner* — Mukundbhai G Patel
(74) *Attorney, Agent, or Firm* — Min-Lee Teng; Litron Patent & Trademark Office (57) ABSTRACT

An electronic module, such as a VRM, has a power inductor and power wave pins disposed on a bottom surface of a circuit board so as to reduce the size and increase the heat dissipation capability of the VRM.

20 Claims, 6 Drawing Sheets

ELECTRONIC MODULE

BACKGROUND OF THE INVENTION

I. Field of the Invention

The present invention relates to an electronic module, and in particular, to a Voltage Regulator Module (VRM).

II. Description of Related Art

As applications of electronic circuits, such as a Voltage Regulator Module (VRM), move toward higher frequency and miniaturization, the distance between VRM and the processor in a server system becomes shorter and shorter so as to reduce the parasitic noise interference in the server system, as a result, the VRM becomes a heat source to the other components such as a processor, which might affect the operations of the processor.

Therefore, a better solution is needed to increase the heat dissipation capability of the VRM to minimize the impact to the other components such as a processor.

SUMMARY OF THE INVENTION

One objective of the present invention is to form an electronic module such as a VRM with a smaller size and larger heat dissipation capability.

In one embodiment of the present invention, an electronic module is disclosed, wherein the electronic module comprises: a circuit board, wherein a plurality of electronic devices are disposed on a top surface of the circuit board; an inductor, is disposed on a bottom surface of the circuit board; and a plurality of wave pins are disposed under the bottom surface of the circuit board, wherein each wave pin comprises a conductive body and at least one recess on a bottom surface of the conductive body, wherein the inductor is electrically connected to a wave pin of the plurality of wave pins.

In one embodiment, each wave pin comprises a conductive body and a plurality of recesses on a bottom surface of the conductive body.

In one embodiment, the conductive body comprises a conductive pillar.

In one embodiment, the conductive body comprises a copper pillar.

In one embodiment, the inductor is a power inductor for connecting to a power supply.

In one embodiment, the circuit board is a PCB.

In one embodiment, the recess has a circular shape.

In one embodiment, the plurality of electronic devices comprises a first MOSFET and a second MOSFET.

In one embodiment, the plurality of wave pins and a plurality of signal pins are disposed in a connecting board, wherein the connecting board is electrically connected to the circuit board via contact points on a top surface of the connecting board.

In one embodiment, the connecting board is a PCB.

In one embodiment, a heat sink is disposed over the plurality of electronic devices.

In one embodiment, a metal layer is electroplated on a top surface of the first MOSFET and a top surface of the second MOSFET, for dissipating heat generated by the first MOSFET and the second MOSFET.

In one embodiment, a first metal layer is electroplated on a top surface of the first MOSFET and a second metal layer is electroplated on a top surface of the second MOSFET, for dissipating heat generated by the first MOSFET and the second MOSFET, wherein the first metal layer and the second metal layer are separated by a gap.

In one embodiment, the plurality of wave pins and a plurality of signal pins are made through metal injection so as to form an insert-molded connecting board, wherein the plurality of wave pins and the plurality of signal pins are electrically connected to the circuit board.

In one embodiment, the plurality of wave pins and a plurality of signal pins are on a connector, wherein the connector is electrically connected to the circuit board.

In one embodiment, the plurality of wave pins and a plurality of signal pins are on a lead frame, wherein the lead frame is electrically connected to the circuit board.

In one embodiment, a molding body is disposed on a top surface of the circuit board to encapsulate the plurality of electronic devices and the heat sink, wherein a top surface of the heat sink is exposed from the molding body.

In one embodiment, the electronic module is a VRM.

In one embodiment of the present invention, an electronic module is disclosed, wherein the electronic module comprises: a circuit board, wherein a plurality of electronic devices are disposed on a top surface of the circuit board; a power inductor, is disposed on a bottom surface of the circuit board; and a plurality of pins, disposed on the bottom surface of the circuit board, wherein the power inductor is electrically connected to a pin of the plurality of pins.

In one embodiment, the circuit board is a PCB.

In one embodiment, the plurality of electronic devices comprises a first MOSFET and a second MOSFET.

In one embodiment, a heat sink is disposed over the plurality of electronic devices.

In one embodiment, a metal layer is electroplated on a top surface of the first MOSFET and a top surface of the second MOSFET, for dissipating heat generated by the first MOSFET and the second MOSFET.

In one embodiment, a first metal layer is electroplated on a top surface of the first MOSFET and a second metal layer is electroplated on a top surface of the second MOSFET, for dissipating heat generated by the first MOSFET and the second MOSFET, wherein the first metal layer and the second metal layer are separated by a gap.

In one embodiment, the plurality of pins are made through metal injection so as to form an insert molding, wherein the insert molding is electrically connected to the circuit board.

In one embodiment, the plurality of pins are on a connector, wherein the connector is electrically connected to the circuit board.

In one embodiment, the plurality of pins are on a lead frame, wherein the lead frame is electrically connected to the circuit board.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
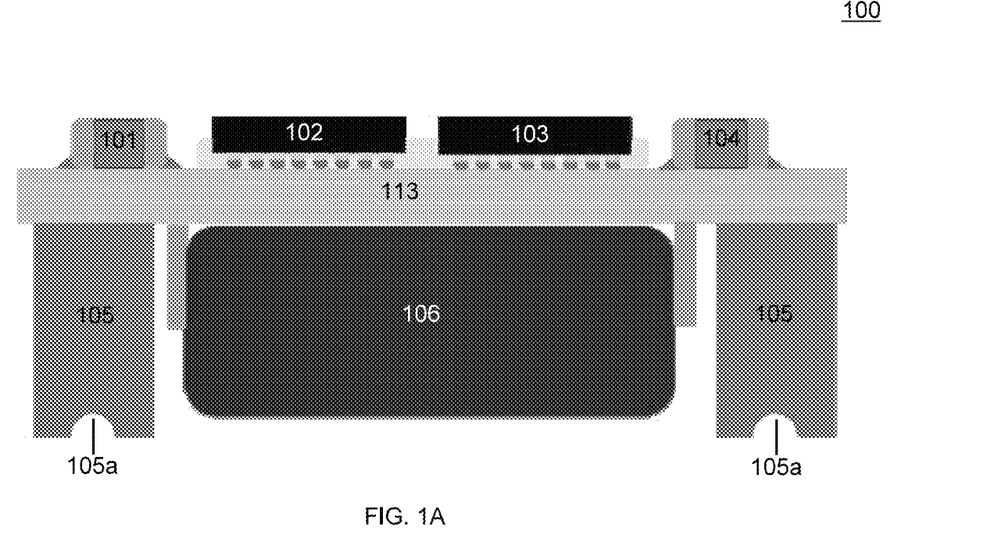
FIG. 1A depicts a side view of an electronic module according to one embodiment of the present invention.

FIG. 1A depicts a side view of an electronic module 100 according to one embodiment of the present invention, wherein the electronic module 100 comprising: a circuit board 113, wherein a plurality of electronic devices 101, 102, 103, 104 are disposed on a top surface of the circuit board 113 comprises a plurality of conductive patterns; an inductor 106, disposed on a bottom surface of the circuit board 113 and electrically connected to a conductive pattern of the circuit board 113; and a plurality of wave pins 105 are disposed under the bottom surface of the circuit board 113 and each of plurality of wave pins 105 is electrically connected to a conductive pattern of the circuit board 113, wherein each of the wave pins 105 comprises at least one recess 105a on a bottom surface of the wave pin 105, wherein the inductor 106 is electrically connected to a wave pin 105 for connecting to an external circuit, such as a motherboard. In one embodiment, the plurality of electronic devices comprises active devices. In one embodiment, the plurality of electronic devices comprises active devices and passive devices.

In one embodiment, each wave pin comprises a conductive body and a plurality of recesses on a bottom surface of the conductive body.

In one embodiment, each conductive body comprises a conductive pillar.

In one embodiment, each conductive body comprises a conductive pillar made of metal.

In one embodiment, each conductive body comprises a copper pillar.

In one embodiment, the electronic module comprises a VRM, and the inductor 106 is a power inductor for connecting to a power supply, wherein the power inductor can sustain a larger current flowing from the power supply.

In one embodiment, the electronic module 100 is a VRM, and the inductor 106 is a power inductor for connecting to a power supply, wherein the power inductor can sustain a larger current flowing from the power supply.

In one embodiment, the circuit board 113 is a PCB.

In one embodiment, the circuit board 113 comprises a metallic substrate.

In one embodiment, the circuit board 113 comprises a ceramic substrate.

In one embodiment, the circuit board 113 comprises a lead frame.

In one embodiment, the recess 105a has a semi-circular shape.

In one embodiment, the recess 105a has a semi-square shape.

In one embodiment, the plurality of electronic devices comprises a first MOSFET 102 and a second MOSFET 103.

Figure 1B:
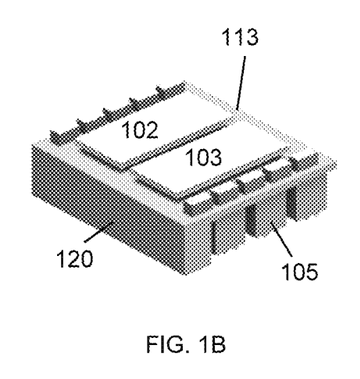
FIG. 1B depicts a top view of an electronic module according to one embodiment of the present invention.
Figure 1C:
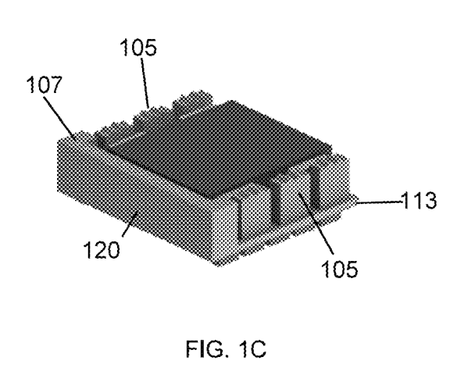
FIG. 1C depicts a bottom view of an electronic module according to one embodiment of the present invention.

FIG. 1B shows the top view of the electronic module 100 and FIG. 1C shows the bottom view of the electronic module 100. In one embodiment, as shown in FIG. 1B and FIG. 1C, a plurality of signal pins 107 are disposed in a connecting board 120, wherein the plurality of signal pins 107 are electrically connected to the circuit board 113.

In one embodiment, the connecting board 120 is a PCB.

In one embodiment, the connecting board 120 comprises a metallic substrate.

In one embodiment, the connecting board 120 comprises a ceramic substrate.

In one embodiment, the connecting board 120 comprises a lead frame.

In one embodiment, the circuit board 113 and the connecting board 120 are made of the same unitary insulating substrate, so that there is no need to have two separate boards 113, 120.

In one embodiment, the circuit board 113 and the connecting board 120 are made of the same unitary metallic substrate, so that there is no need to have two separate boards 113, 120.

Figure 2:
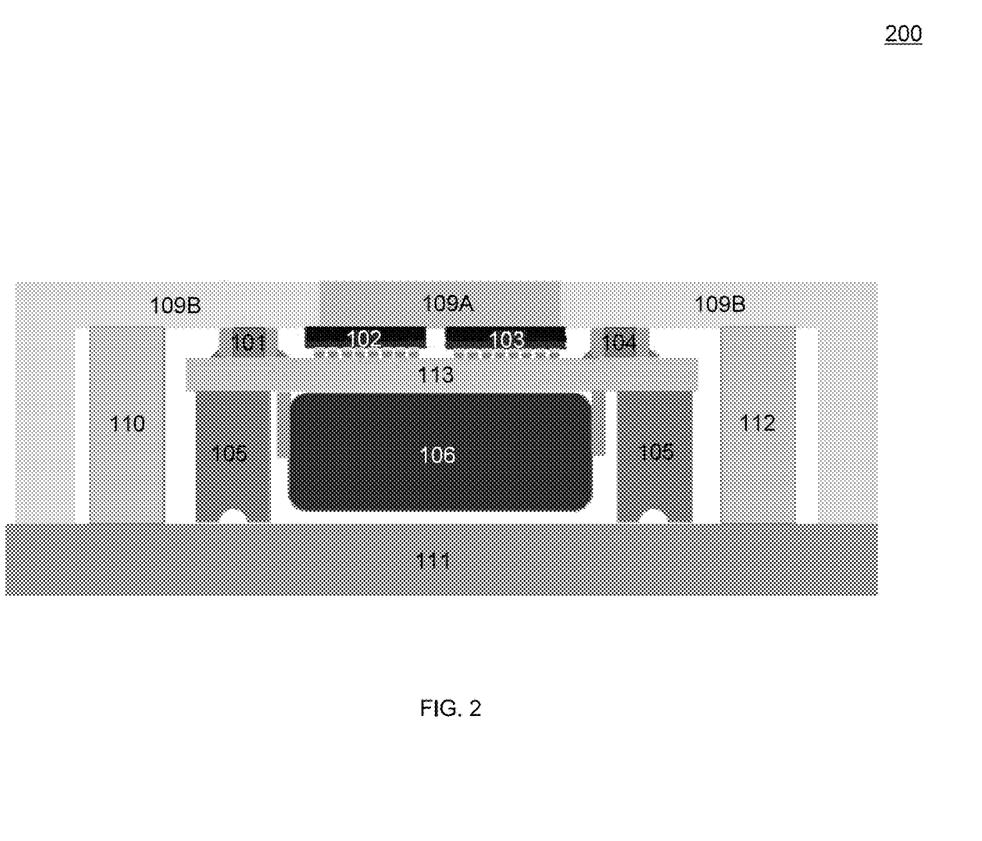
FIG. 2 depicts a side view of an electronic module according to one embodiment of the present invention.

FIG. 2 depicts a side view of an electronic module 200 according to one embodiment of the present invention, wherein a heat sink having portions 109A, 109B is disposed over the plurality of electronic devices 101, 102, 103, 104. In one embodiment, the portions 109A, 109B are made of the same material and portions 109A, 109B are integrated formed. In one embodiment, the portions 109A, 109B are made of different materials, wherein the portion 109A can be integrated with the active devices 102, 103 or can be made of a material that has a larger heat dissipation capability than the portion 109B. In one embodiment, spacers 110 can be disposed between the heat sink 109B and a motherboard 111.

Figure 3A:
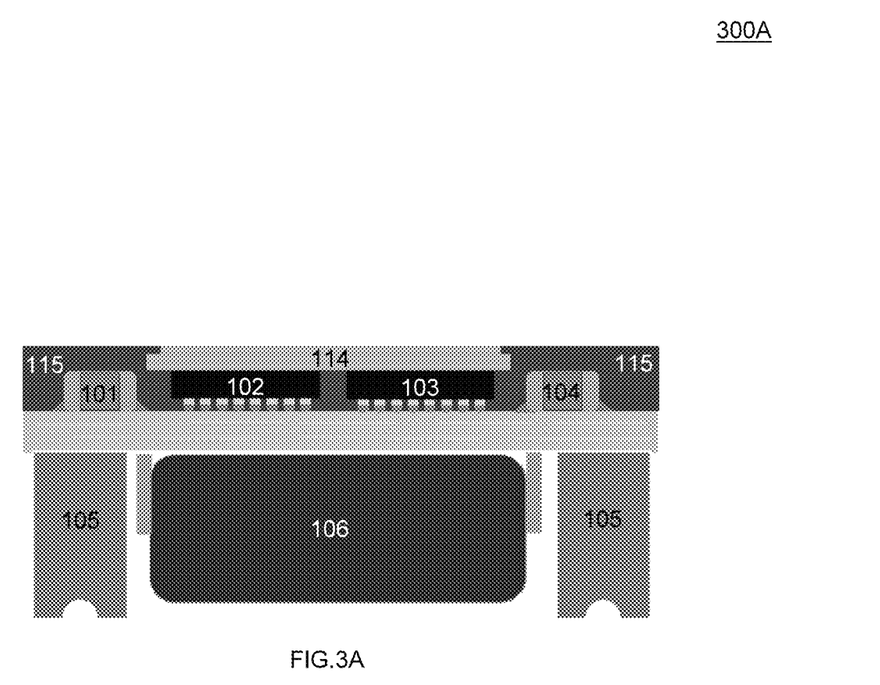
FIG. 3A depicts a side view of an electronic module according to one embodiment of the present invention.

FIG. 3A depicts a side view of an electronic module 300A according to one embodiment of the present invention, wherein a heat sink 114 made of metal that is electroplated on a top surface of the first MOSFET 102 and a top surface of the second MOSFET 103, for dissipating heat generated by the first MOSFET 102 and the second MOSFET 103.

Figure 3B:
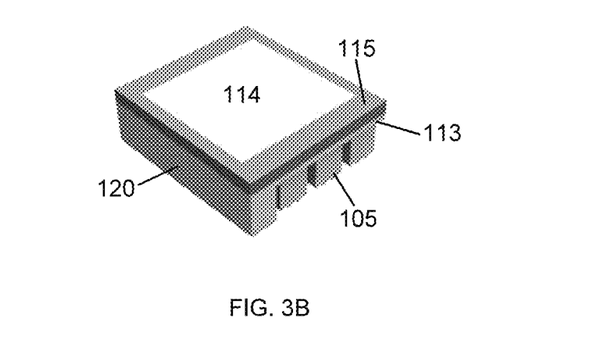
FIG. 3B depicts a top view of an electronic module according to one embodiment of the present invention.

In one embodiment, as shown in FIG. 3A, a molding material is disposed on a top surface of the circuit board 113 to encapsulate the plurality of electronic devices 101, 102, 103, 104 and the heat sink 114 to form a molding body 115, wherein a top surface of the heat sink 114 is exposed from the molding body 115 for dissipating heat, as shown in FIG. 3B which shows a bottom view of the electronic module 300A.

In one embodiment the molding body 115 is made of EMC (Epoxy molding compound).

Figure 3C:
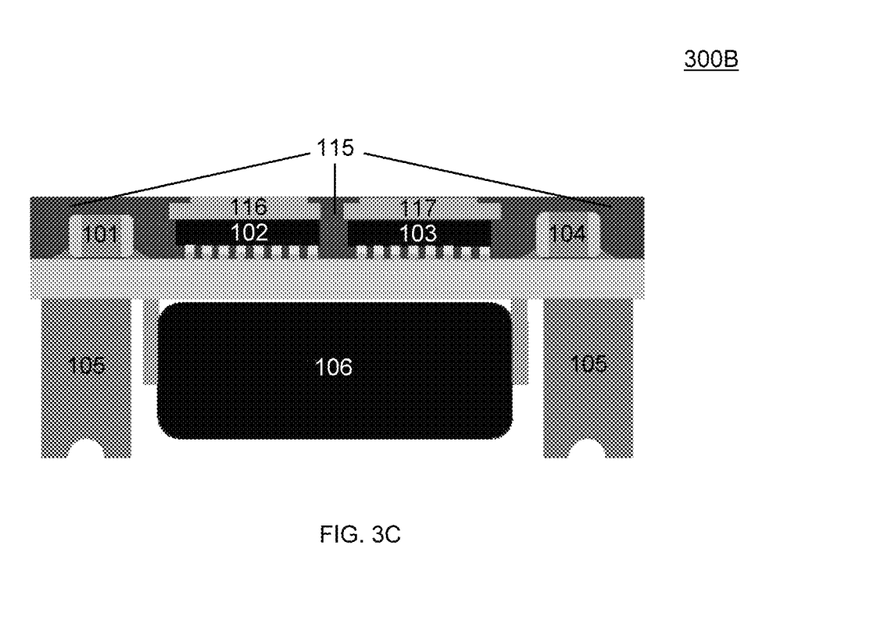
FIG. 3C depicts a side view of an electronic module according to one embodiment of the present invention.

FIG. 3C depicts a side view of an electronic module 300B according to one embodiment of the present invention, wherein a first metal layer 116 is electroplated on a top surface of the first MOSFET 102 and a second metal layer 117 is electroplated on a top surface of the second MOSFET 103, for dissipating heat generated by the first MOSFET 102 and the second MOSFET 103, wherein the first metal layer 116 and the second metal layer 117 are separated by a gap.

In one embodiment, a molding material encapsulates the plurality of electronic devices 101, 102, 103, 104 to form a molding body 115. In one embodiment, a molding material encapsulates the plurality of electronic devices 101, 102, 103, 104 and extends into said gap between the first metal layer 116 and the second metal layer 117, so as to form a molding body 115.

In one embodiment, the top surface of the heat sink 116, 117 are exposed from the molding body 115.

Figure 4A:
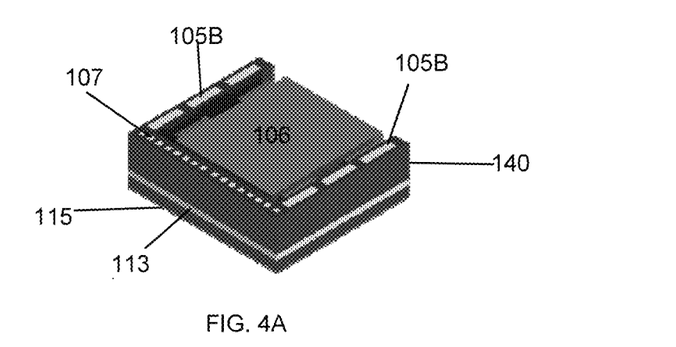
FIG. 4A depicts a bottom view of an electronic module according to one embodiment of the present invention.

In one embodiment, instead of using the power wave pins 105 in each of the electronic module 100, 200, 300A, 300B, a plurality of power pins 105B and a plurality of signal pins 107 can be disposed on the bottom surface of the circuit board 113, as shown in FIG. 4A which depicts a bottom view of the electronic module 100, 200, 300A, 300B when power wave pins 105 are not used, wherein each pin is electrically connected to the bottom surface of the circuit board 113, wherein the power pin 105B has a larger size than the signal pin 107 and the bottom surface of each power pin 105B can have a flat surface.

In one embodiment, as shown in FIG. 4A, the plurality of power pins 105B and the plurality of signal pins 107 are made through a process of insert molding so as to form an insert-molded connecting board 140, wherein the plurality of power pins 105B and the plurality of signal pins 107, in the insert-molded connecting board 140, are electrically connected to the circuit board 113.

Figure 4B:
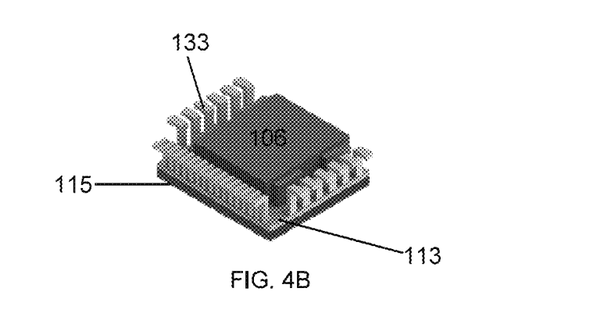
FIG. 4B depicts a bottom view of an electronic module according to one embodiment of the present invention.

In one embodiment, the plurality of pins 133 are made by a lead frame, wherein the plurality of pins 133 are electrically connected to the circuit board 113, as shown in FIG. 4B.

Figure 4C:
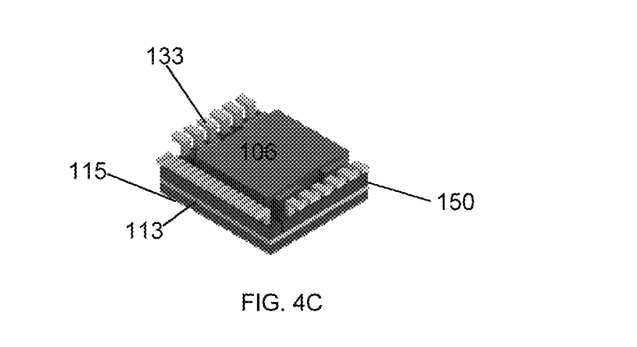
FIG. 4C depicts a bottom view of an electronic module according to one embodiment of the present invention.

In one embodiment, the plurality of pins 133 are on a connector 150, wherein the plurality of pins 133 are electrically connected to the circuit board 113, as shown in FIG. 4C.

Figure 5:
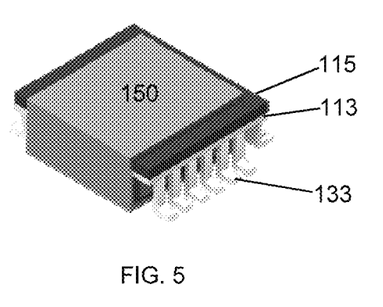
FIG. 5 depicts a top view of an electronic module according to one embodiment of the present invention.

FIG. 5 depicts a top view of the electronic module according to one embodiment of the present invention, wherein a heat sink 150 can be disposed on the molding body 115 to dissipate the heat generated by the electronic module.

What is claimed is:

1. An electronic module, comprising:
a circuit board, wherein a plurality of electronic devices are disposed on a top surface of the circuit board;
an inductor, disposed on a bottom surface of the circuit board; and
a plurality of wave pins, disposed under the bottom surface of the circuit board, wherein a first wave pin comprises a conductive body and a recess on a bottom surface of the conductive body, wherein the inductor is electrically connected to the first wave pin, wherein a top surface of the conductive body is in contact with the bottom surface of the circuit board with a first portion of the conductive body extending vertically from a first portion of said top surface of the conductive body to the recess, wherein a second portion of the conductive body extends vertically from an outer portion of the bottom surface of the conductive body to a second portion of said top surface of the conductive body, said outer portion of the bottom surface of the conductive body being located at a lateral side of the recess.

2. The electronic module according to claim 1, wherein the inductor is a power inductor for connecting to a power supply.

3. The electronic module according to claim 1, wherein the circuit board is a PCB.

4. The electronic module according to claim 1, wherein said recess has a semi-circular shape.

5. The electronic module according to claim 1, wherein the plurality of electronic devices comprises a first MOSFET and a second MOSFET.

6. The electronic module according to claim 5, wherein a contiguous metal layer is electroplated on a top surface of the first MOSFET and a top surface of the second MOSFET, for dissipating heat generated by the first MOSFET and the second MOSFET.

7. The electronic module according to claim 6, wherein a molding body is disposed on the top surface of the circuit board to encapsulate the plurality of electronic devices and the contiguous metal layer, wherein a top surface of the contiguous metal layer is exposed from the molding body.

8. The electronic module according to claim 5, wherein a first metal layer is electroplated on a top surface of the first MOSFET and a second metal layer is electroplated on a top surface of the second MOSFET, for dissipating heat generated by the first MOSFET and the second MOSFET, wherein the first metal layer and the second metal layer are separated by a horizontal gap.

9. The electronic module according to claim 8, wherein a molding body is disposed on the top surface of the circuit board to encapsulate the plurality of electronic devices and the first metal layer and the second metal layer, wherein a top surface of each of the first metal layer and the second metal layer is exposed from the molding body.

10. The electronic module according to claim 1, wherein the plurality of wave pins and a plurality of signal pins are disposed in a connecting board, wherein the plurality of wave pins and the plurality of signal pins are electrically connected to the circuit board.

11. The electronic module according to claim 10, wherein the connecting board is a PCB.

12. The electronic module according to claim 1, wherein a heat sink is disposed over the plurality of electronic devices.

13. The electronic module according to claim 1, wherein the plurality of wave pins and a plurality of signal pins are made through metal injection so as to form an insert-molded connecting board, wherein the plurality of wave pins and the plurality of signal pins are electrically connected to the circuit board.

14. The electronic module according to claim 1, wherein the plurality of wave pins and a plurality of signal pins are on a connector, wherein the plurality of wave pins and the plurality of signal pins are electrically connected to the circuit board.

15. The electronic module according to claim 1, wherein the plurality of wave pins and a plurality of signal pins are made by a lead frame, wherein the plurality of wave pins and the plurality of signal pins are electrically connected to the circuit board.

16. The electronic module according to claim 1, wherein the electronic module is a VRM.

17. The electronic module according to claim 1, wherein a plurality of recesses are on the bottom surface of the conductive body.

18. The electronic module according to claim 1, wherein the conductive body comprises a conductive pillar.

19. An electronic module, comprising:
a circuit board, wherein a plurality of electronic devices are disposed on a top surface of the circuit board;
a power inductor, disposed on a bottom surface of the circuit board; and
a plurality of power pins and a plurality of signal pins, disposed on the bottom surface of the circuit board, wherein the size of a first power pin is larger than that of a signal pin, and the power inductor is electrically connected to the first power pin, wherein the first power pin comprises a conductive body and a recess on a bottom surface of the conductive body, wherein a top surface of the conductive body is in contact with the bottom surface of the circuit board with a first portion of the conductive body extending vertically from a first portion of said top surface of the conductive body to the recess, wherein a second portion of the conductive body extends vertically from an outer portion of the bottom surface of the conductive body to a second portion of said top surface of the conductive body, said outer portion of the bottom surface of the conductive body being located at a lateral side of the recess.

20. The electronic module according to claim 19, wherein the conductive body comprises a conductive pillar.

* * * * *